(12) United States Patent
Iizuka

(10) Patent No.: US 9,251,918 B2
(45) Date of Patent: Feb. 2, 2016

(54) SEMICONDUCTOR MEMORY DEVICE

(71) Applicant: KABUSHIKI KAISHA TOSHIBA, Minato-ku, Tokyo (JP)

(72) Inventor: Mariko Iizuka, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 156 days.

(21) Appl. No.: 14/198,363

(22) Filed: Mar. 5, 2014

(65) Prior Publication Data

US 2015/0063013 A1    Mar. 5, 2015

Related U.S. Application Data

(60) Provisional application No. 61/873,795, filed on Sep. 4, 2013.

(51) Int. Cl.
*G11C 29/00* (2006.01)
*G11C 11/00* (2006.01)
*G11C 7/00* (2006.01)
*G11C 11/16* (2006.01)

(52) U.S. Cl.
CPC .............. *G11C 29/702* (2013.01); *G11C 11/16* (2013.01)

(58) Field of Classification Search
CPC .. G11C 29/808; G11C 29/846; G11C 29/848; G11C 29/785; G11C 29/4401; G11C 29/802; G11C 2229/723; G11C 29/42; G11C 7/10; G11C 29/84; G11C 29/842; G11C 11/165; G11C 11/1653; G11C 11/1655
See application file for complete search history.

(56) References Cited

U.S. PATENT DOCUMENTS

| | | | |
|---|---|---|---|
| 5,831,913 A | 11/1998 | Kirihata | |
| 2008/0291760 A1* | 11/2008 | Ito | G11C 29/80 365/200 |
| 2010/0157693 A1 | 6/2010 | Iwai et al. | |
| 2010/0246299 A1* | 9/2010 | Iwai | G11C 29/842 365/200 |

FOREIGN PATENT DOCUMENTS

| | | |
|---|---|---|
| JP | 2003-085995 A | 3/2003 |
| JP | 2010-009656 A | 1/2010 |

* cited by examiner

*Primary Examiner* — Hien Nguyen
(74) *Attorney, Agent, or Firm* — Holtz, Holtz Volek PC

(57) ABSTRACT

A semiconductor memory device includes: a bank including a normal area including normal columns, and a redundancy area including redundancy columns and to be replaced with a failure column of the normal area; sense amplifiers connected to the normal area; and a redundancy sense amplifier connected to the redundancy area. A normal replacement unit is formed of normal columns allocated to each of the sense amplifiers. A redundancy replacement unit is formed of redundancy columns allocated to the redundancy sense amplifier. The redundancy replacement unit is smaller than the normal replacement unit.

16 Claims, 15 Drawing Sheets

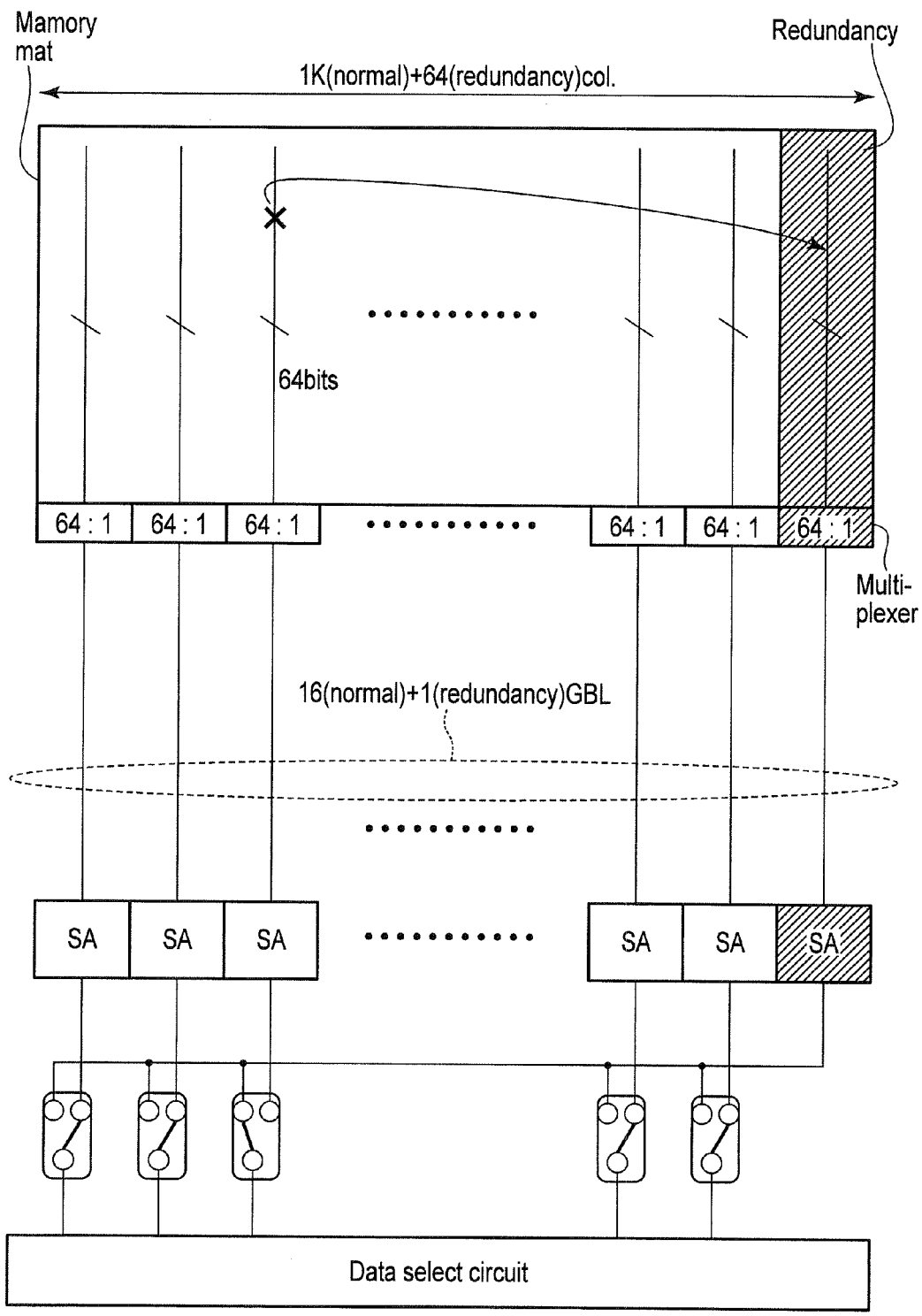
F I G. 4

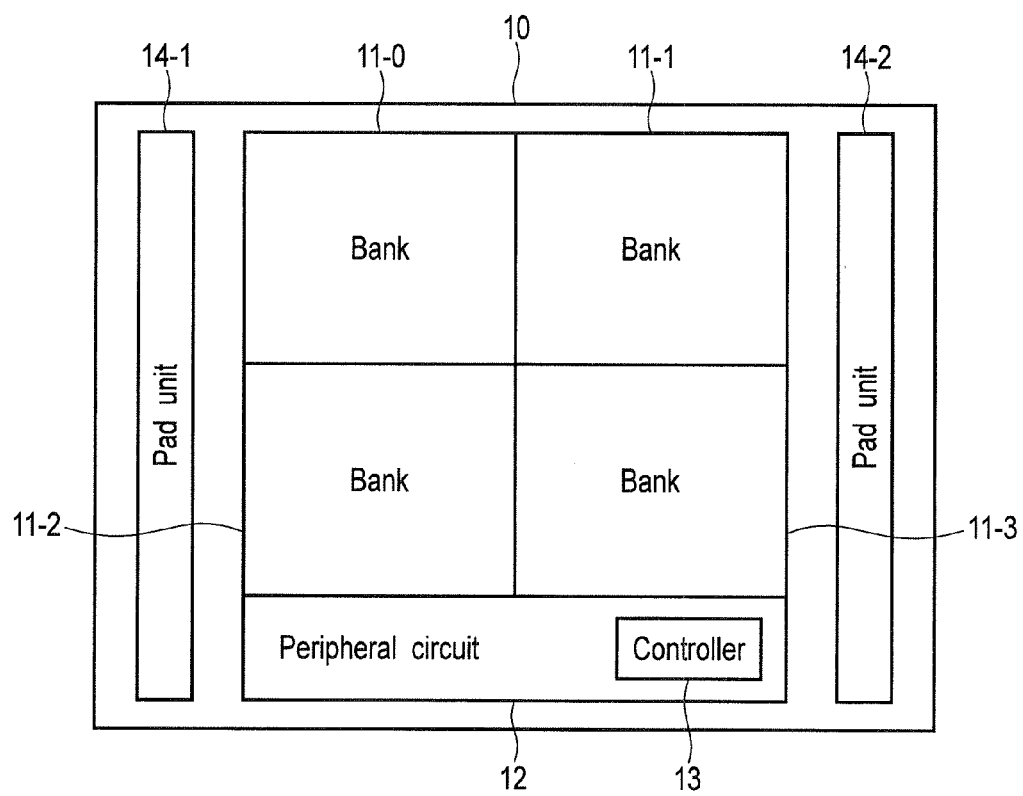
F I G. 7

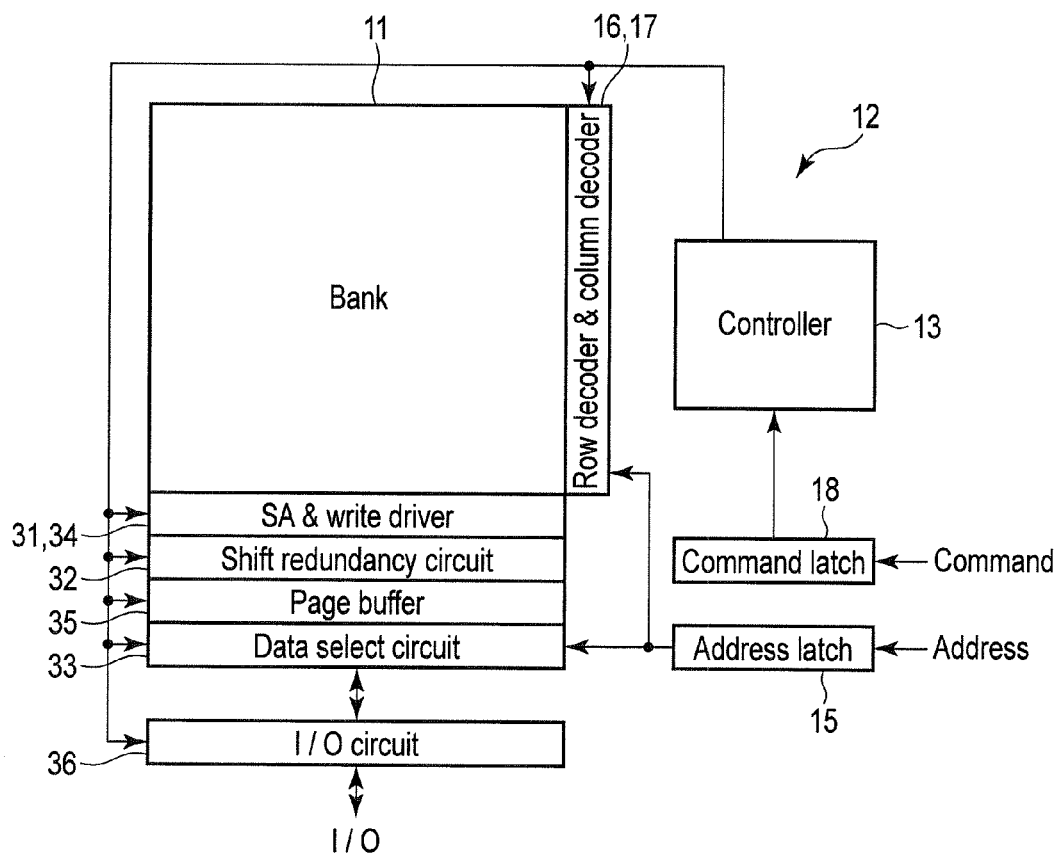
F I G. 8

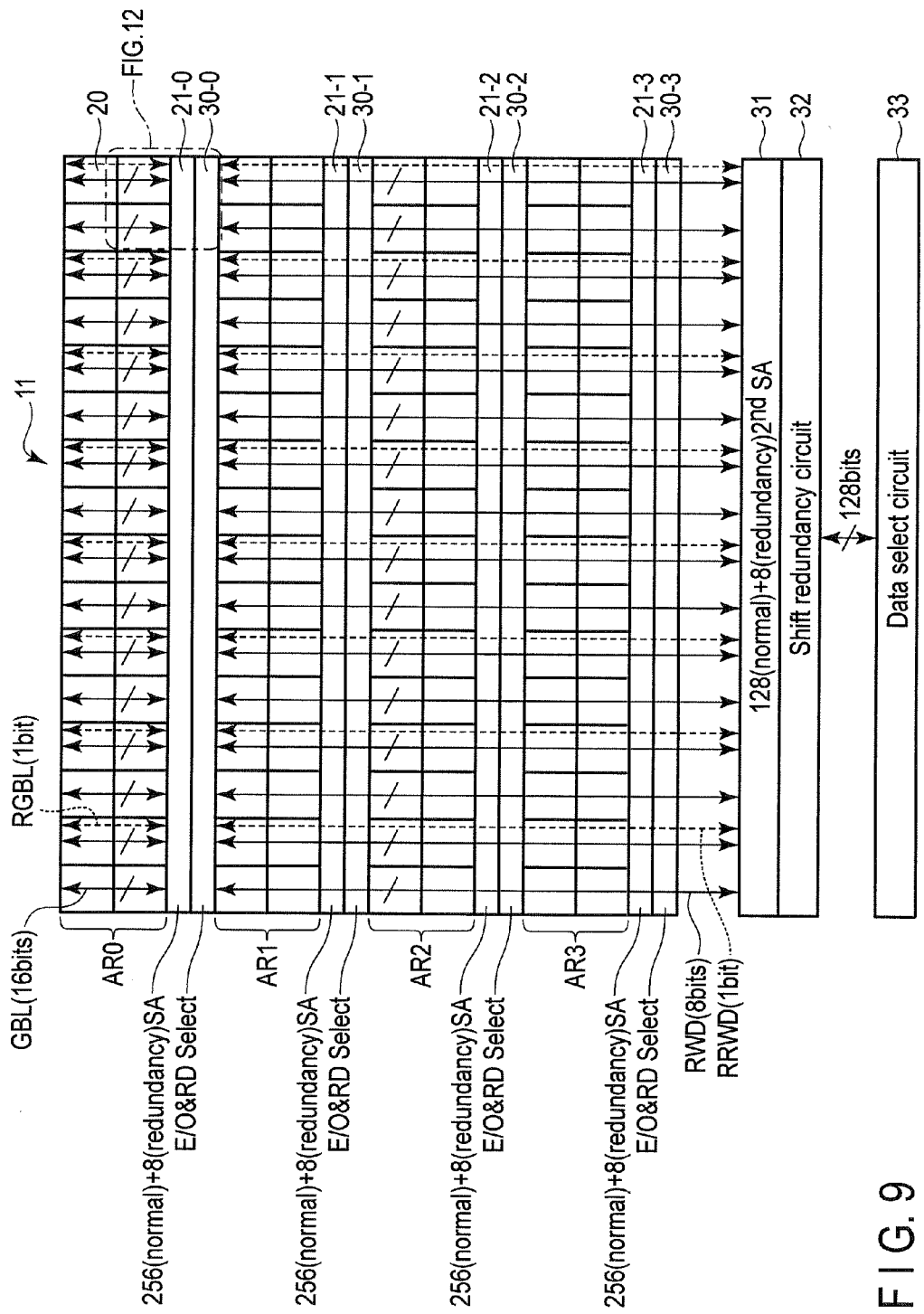
F I G. 9

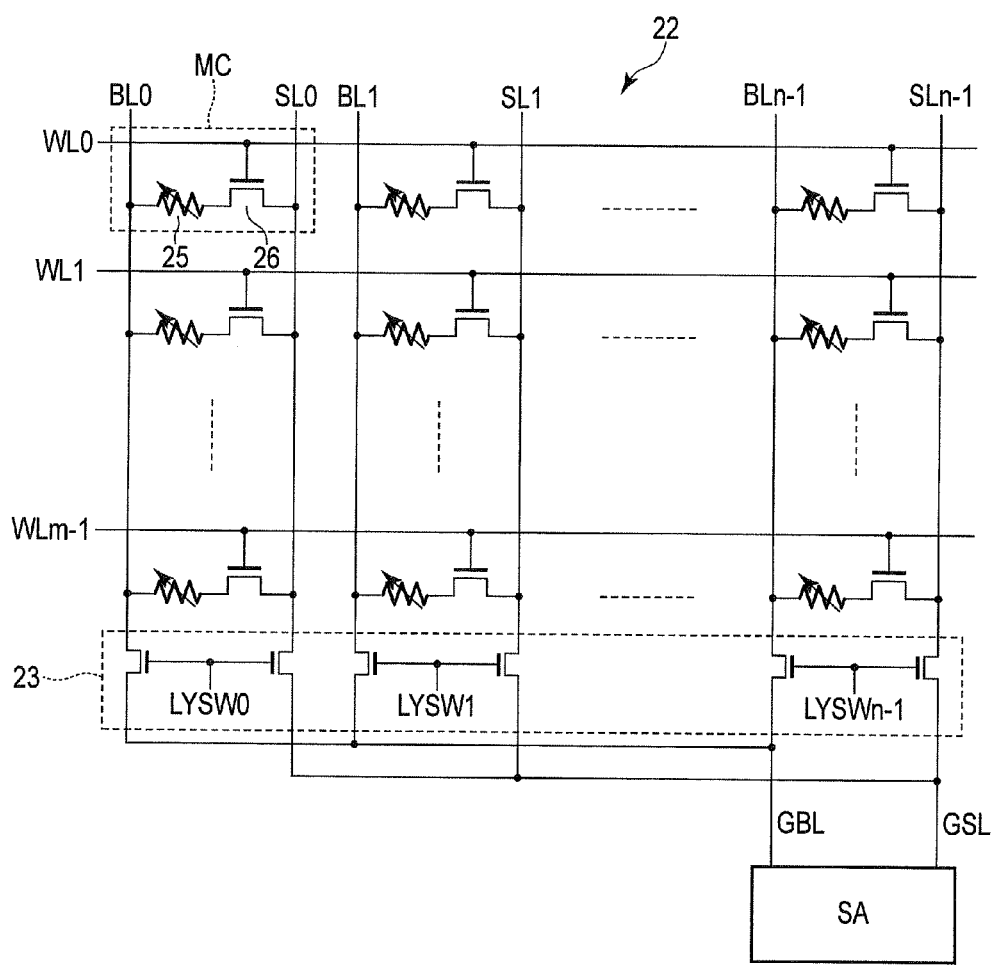
F I G. 11

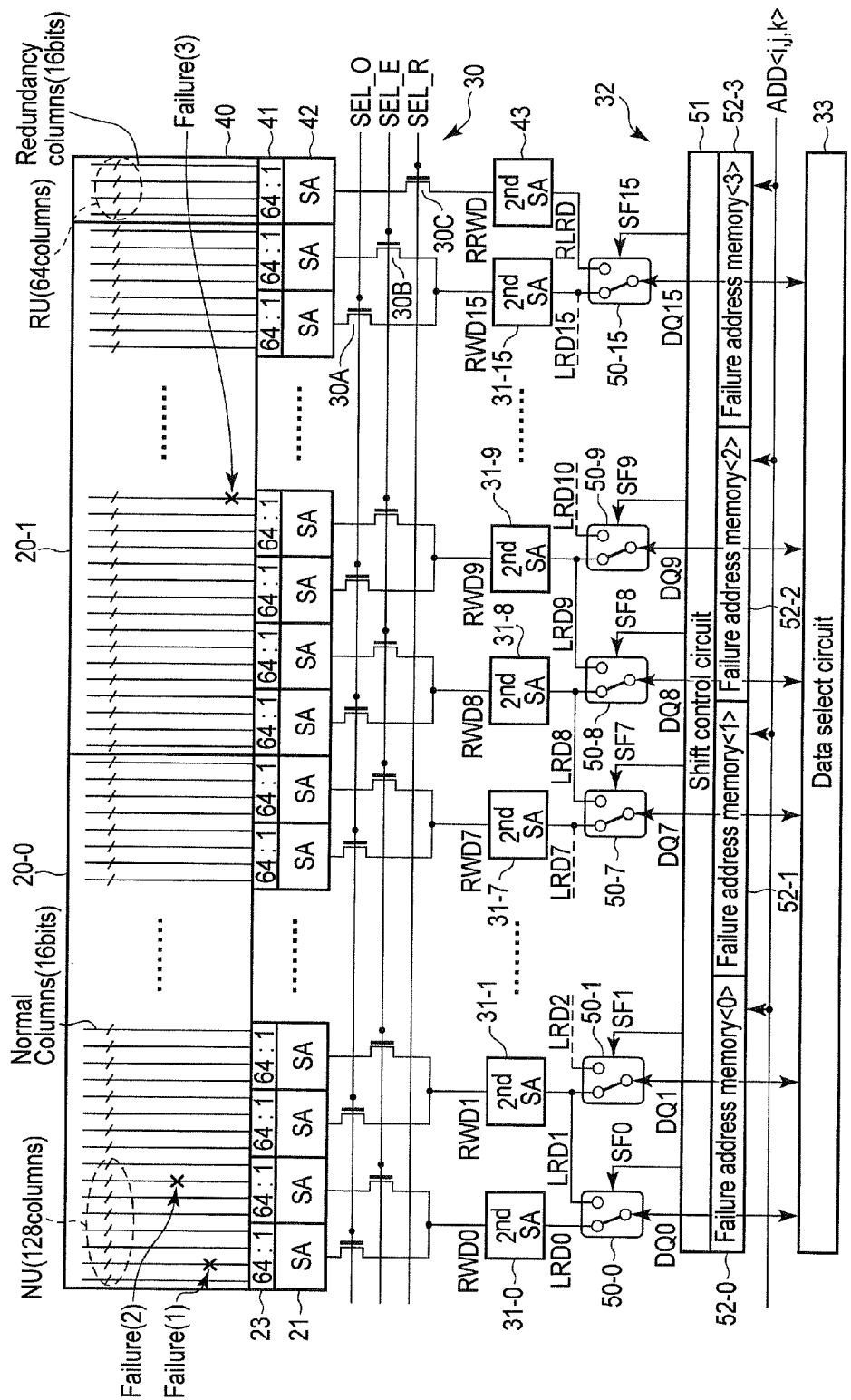
F I G. 12

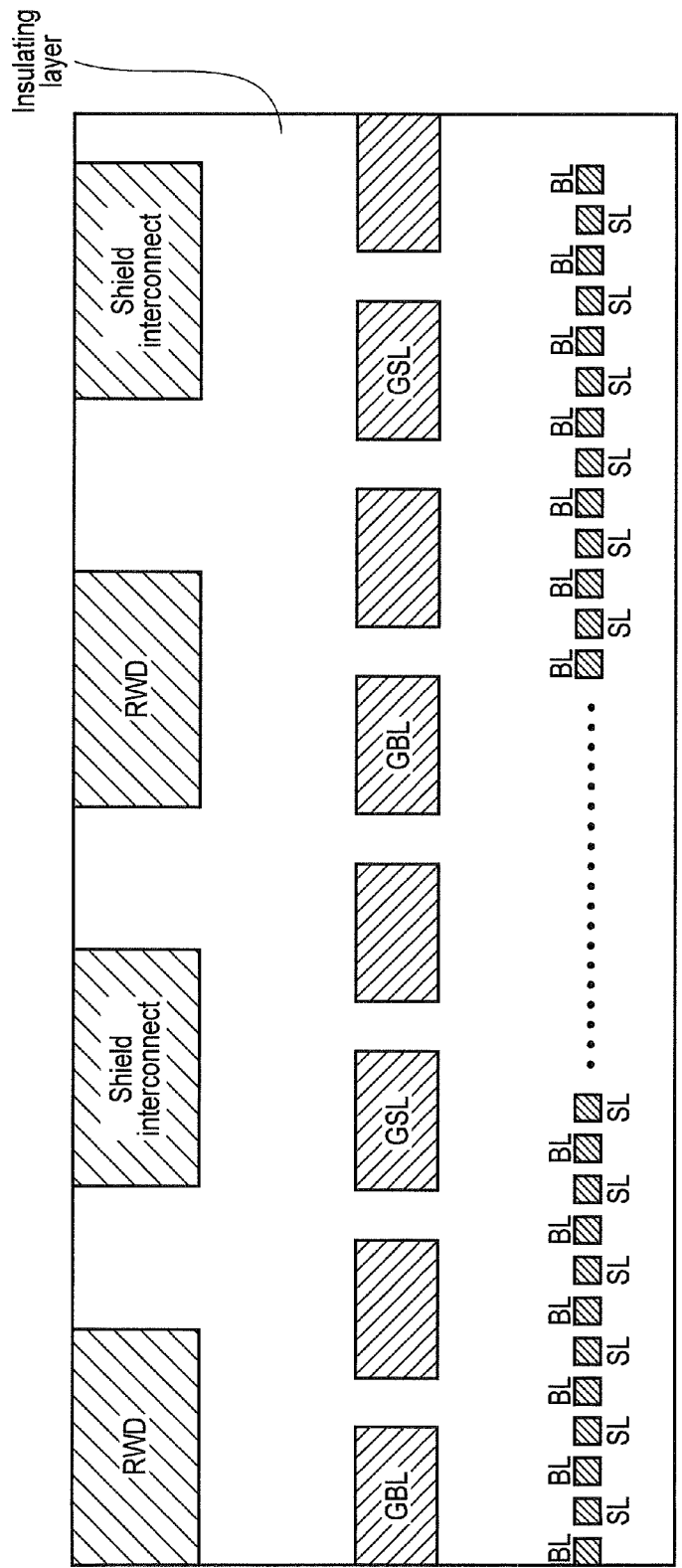
F I G. 17

SEMICONDUCTOR MEMORY DEVICE

CROSS-REFERENCE TO RELATED APPLICATIONS

This application claims the benefit of U.S. Provisional Application No. 61/873,795, filed Sep. 4, 2013, the entire contents of which are incorporated herein by reference.

FIELD

Embodiments described herein relate generally to a semiconductor memory device.

BACKGROUND

A redundancy circuit system is adopted in semiconductor memory devices, to relieve failure bits and improve a yield. In the redundancy circuit system, a redundancy cell array is disposed for an ordinary memory cell array.

BRIEF DESCRIPTION OF THE DRAWINGS

FIG. 4 is a schematic diagram for illustrating a ratio of redundancy columns;

FIG. 7 is a block diagram of a semiconductor memory device according to the present embodiment;

FIG. 8 is a block diagram of an example of a peripheral circuit;

FIG. 9 is a block diagram of a bank;

FIG. 11 is a circuit diagram of a memory cell array;

FIG. 12 is a block diagram of a circuit part enclosed by a dashed line in FIG. 9 and a shift redundancy circuit;

FIG. 17 is a cross-sectional view of a stacked structure of interconnects.

DETAILED DESCRIPTION

In general, according to one embodiment, there is provided a semiconductor memory device comprising:

a bank including a normal area including normal columns, and a redundancy area including redundancy columns and to be replaced with a failure column of the normal area;

sense amplifiers connected to the normal area; and a redundancy sense amplifier connected to the redundancy area, wherein a normal replacement unit is formed of normal columns allocated to each of the sense amplifiers, a redundancy replacement unit is formed of redundancy columns allocated to the redundancy sense amplifier, and the redundancy replacement unit is smaller than the normal replacement unit.

An embodiment of the present invention will now be described with reference to the drawings. In the following explanation, the same reference numbers are assigned to constituent elements having similar functions and structures, and overlapping explanations will be made only when necessary.

[Consideration]

Figure 2:
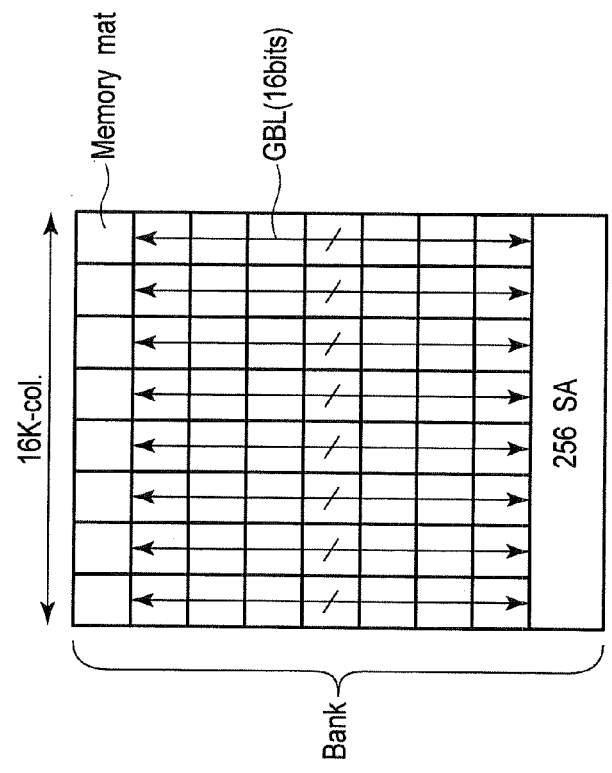
FIG. 2 is a schematic diagram of an example of a structure of a bank.
Figure 1:
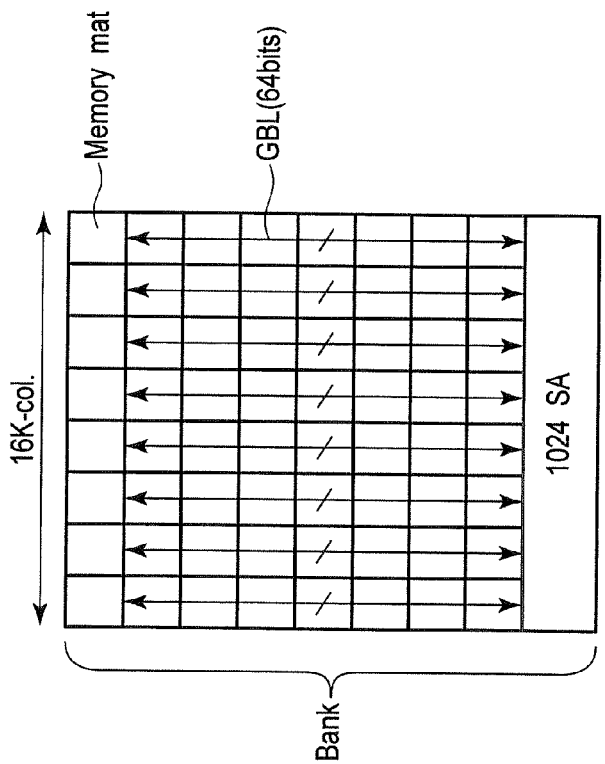
FIG. 1 is a schematic diagram of an example of a structure of a bank.

FIG. 1 and FIG. 2 are schematic diagrams of an example of a structure of a bank. A bank includes a plurality of memory mats and a plurality of sense amplifiers SA. In the specification of the bank, the number of sense amplifiers is equal to the page size. Each memory mat is connected with a plurality of global bit lines GBL. The number of columns in a bank is, for example, 16 K. K is equal to 1024. FIG. 1 is an example of a structure of a bank in which the page size is 1 Kbit, the page size is 256 bits, and the number of sense amplifiers is 256, which is equal to the page size. In FIG. 1, the number of columns accompanying a sense amplifier SA is 16. In FIG. 2, the number of columns accompanying a sense amplifier SA is 64. As described above, in a bank in which the page size is equal to the number of sense amplifiers, the number of columns accompanying a sense amplifier SA differs according to the page size determined by the specification. Specifically, the number of columns accompanying a sense amplifier SA increases when the page size is reduced.

Figure 3:
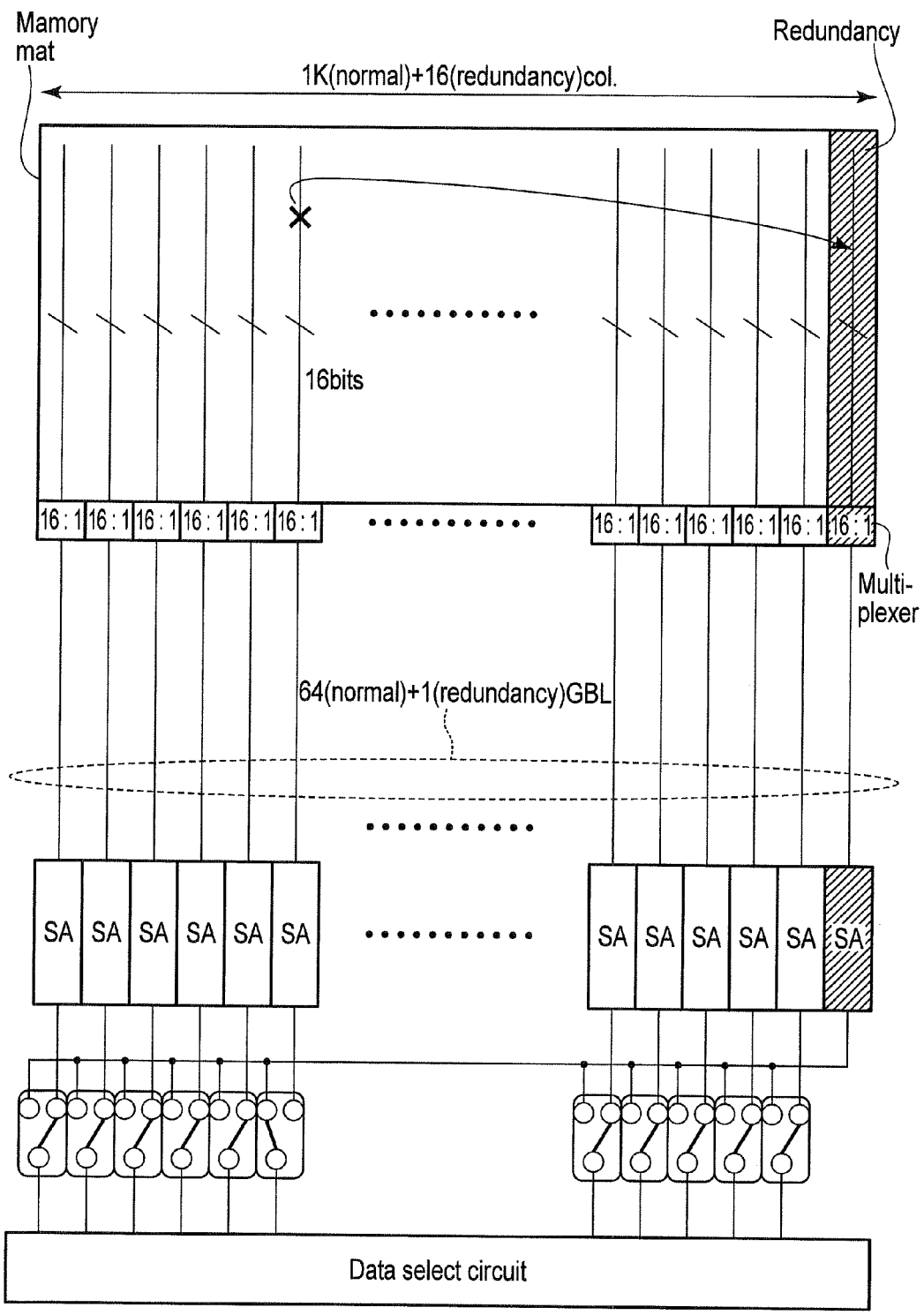
FIG. 3 is a schematic diagram for illustrating a ratio of redundancy columns.

FIG. 3 and FIG. 4 are schematic diagrams for illustrating a ratio of redundancy columns. Replacement by a redundancy data line is performed by controlling a gate of a replacement switch that is connected to a circuit (for example, a sense amplifier SA) that can be provided in common for a plurality of columns. FIG. 3 is a schematic diagram of replacement by a redundancy line accompanying a memory mat having the number of columns of 1 K, in a bank having a page size of 1 Kbit and illustrated in FIG. 1. FIG. 4 is a schematic diagram of replacement by a redundancy line accompanying a memory mat having the number of columns of 1 K, in a bank having a page size of 256 bits and illustrated in FIG. 2. In FIG. 3, the ratio of redundancy columns to normal columns is 1 to 64. In FIG. 4, the ratio of redundancy columns to normal columns is 1 to 16. As described above, the number of columns accompanying a sense amplifier SA increases as the page size is reduced, and consequently the ratio of redundancy columns increases.

Figures 5, 6:
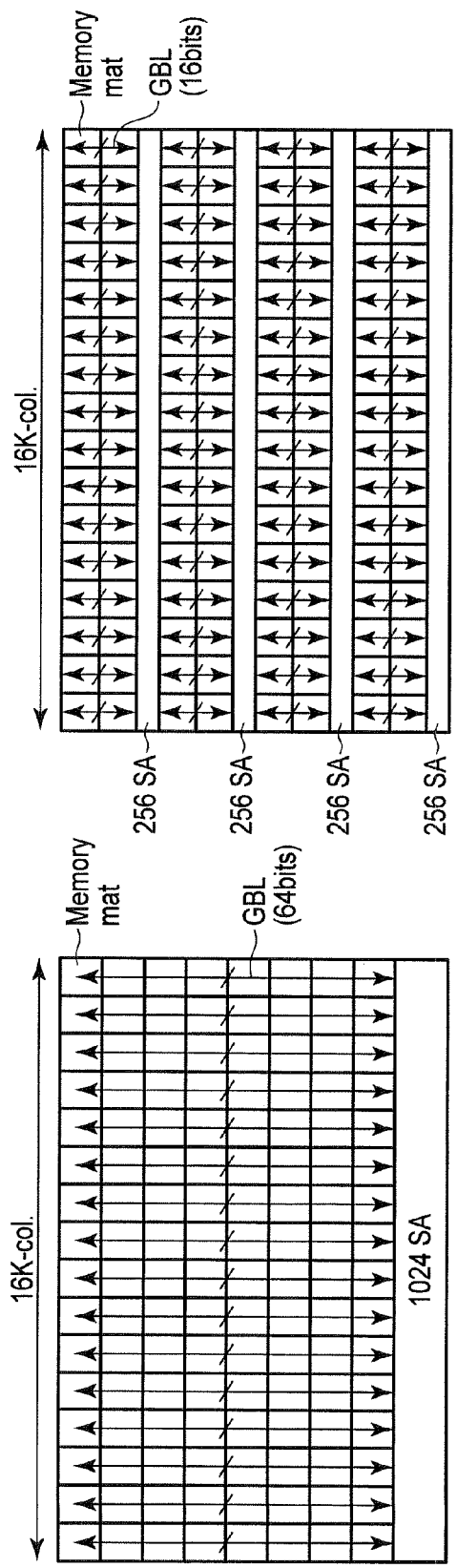
FIG. 5 is a schematic diagram for illustrating an example of arrangement of global bit lines and a sense amplifier.
FIG. 6 is a schematic diagram for illustrating an example of arrangement of global bit lines and sense amplifiers.

FIG. 5 and FIG. 6 are schematic diagrams for illustrating examples of arrangement of global bit lines GBL and sense amplifiers SA. FIG. 5 illustrates a bank, in which the page size is 1 Kbit, and the number of columns is 16 K. For example, 64 global bit lines GBL are connected to each memory mat line in the column direction. Although sense amplifiers SA connected to the global bit lines GBL are arranged at an end of the bank in FIG. 5, the global bit lines GBL are long in such cases, and consequently the global bit lines GBL have increased resistance and capacity.

FIG. 6 illustrates an example of a structure in which all the sense amplifiers SA are divided into four groups, and the four groups of sense amplifiers are distributed. Although the structure of FIG. 6 can shorten the global bit lines GBL, it increases the number of columns accompanying a sense amplifier SA. Specifically, although the number of columns accompanying a sense amplifier SA is 16 in FIG. 5, the number of columns is 64 in FIG. 6.

In consideration of the above, embodiments will be explained hereinafter with reference to the drawings. In the following embodiment, an MRAM (Magnetic Random Access Memory) will be explained as an example of a semiconductor memory device.

[Embodiments]

FIG. 7 is a block diagram of a semiconductor memory device 10 according to the present embodiment. The semiconductor memory device 10 includes a plurality of banks 11, a peripheral circuit 12, and pad units 14-1 and 14-2. FIG. 7 illustrates four banks 11-0 to 11-3, as an example. In the following explanation of the present embodiment, the branch numbers will be omitted when it is unnecessary to distinguish the banks 11-0 to 11-3 from one another, and the wording "bank 11" will be used for explanation of each of the banks 11-0 to 11-3. Other reference numbers with branch numbers are treated in a similar manner as the banks.

The peripheral circuit 12 controls input and output of data from and to the external device of the semiconductor memory device 10. In addition, the peripheral circuit 12 includes a controller 13 that controls operations (including data writing operation, data reading operation, and data erasing operation) of the bank 11. Each of the pad units 14 includes a plurality of terminals, and is used for inputting/outputting data and control signals from and to the external device.

FIG. 8 is a block diagram illustrating an example of the peripheral circuit 12. The peripheral circuit 12 includes a controller 13, a command latch circuit 18, an address latch circuit 15, a row decoder 16, a column decoder 17, a sense amplifier unit (SA) 31, a write driver 34, a shift redundancy circuit 32, a page buffer 35, a data select circuit 33, and an input/output (I/O) circuit 36.

The command latch circuit 18 latches a command input from the external. The address latch circuit 15 latches an address input from the external. The row decoder 16 selects a row of the bank, based on a row address input from the address latch circuit 15. The column decoder 17 selects a column of the bank, based on a column address input from the address latch circuit 15.

The sense amplifier 31 senses and amplifies data read from the bank. The write driver 34 writes data stored in the page buffer 35 to the bank. The shift redundancy circuit 32 performs replacement operation for a failure column when a failure occurs in a column in the bank. The page buffer 35 temporarily stores write data input from the external in data writing, and temporarily stores read data read from the bank. The data select circuit 33 selects a predetermined number of data items in the page stored in the page buffer 35. The input/output circuit 36 controls data input and output from and to the external.

FIG. 9 is a block diagram of a bank 11. The number of columns of each bank 11 is, for example, 16 K. The bank 11 is divided into a plurality of areas AR (for example, four areas AR0 to AR3 in the present embodiment). An area AR includes a plurality of memory mats 20. Each memory mat 20 is a block that stores data, and includes a memory cell array.

First sense amplifier units 21-0 to 21-3 are connected to the areas AR0 to AR3, respectively. Specifically, in the present embodiment, all the sense amplifiers SA in the bank 11 are divided into four groups, and arranged in a distributed manner. The bank 11 has a page size of 1 Kbit, for example. The number of sense amplifiers in the bank 11 corresponds to the page size. Each of the sense amplifier units 21-0 to 21-3 includes 256 normal sense amplifiers and 8 redundancy sense amplifiers.

In each area AR, memory mats (for example, two memory mats in the present embodiment) arranged in a line in the column direction (vertical direction) are connected with 16 global bit lines GBL in common. In addition, a redundancy global bit line RGBL is disposed on four memory mats that are connected to 32 adjacent global bit lines GBL. The global bit lines GBL and the redundancy global bit lines RGBL arranged in the area AR are connected to the corresponding sense amplifier unit 21. The sense amplifier units 21-0 to 21-3 are connected to select circuits (E/O & RD select) 30-0 to 30-3.

Each select circuit 30 selects either even-numbered global bit lines or odd-numbered global bit lines, and selects a redundancy global bit line RGBL when a failure column is relieved. The select circuits 30-0 to 30-3 are connected to a plurality of data lines RWD, and a plurality of redundancy data lines RRWD. Eight data lines RWD are provided for eight memory mats arranged in a line in the column direction. A redundancy data line RRWD is provided for 16 memory mats arranged in 2 lines in the column direction.

The 128 data lines RWD and the 8 redundancy global bit lines RGBL are connected to a second sense amplifier unit 31. The second sense amplifier circuit 31 is connected with the shift redundancy circuit 32. The shift redundancy circuit 32 shifts the data line RWD when a failure column is relieved. Then, the shift redundancy circuit 32 performs replacement operation for a failure column, using the redundancy data line RRWD. The shift redundancy circuit 32 is connected to the data select circuit 33.

Figure 10:
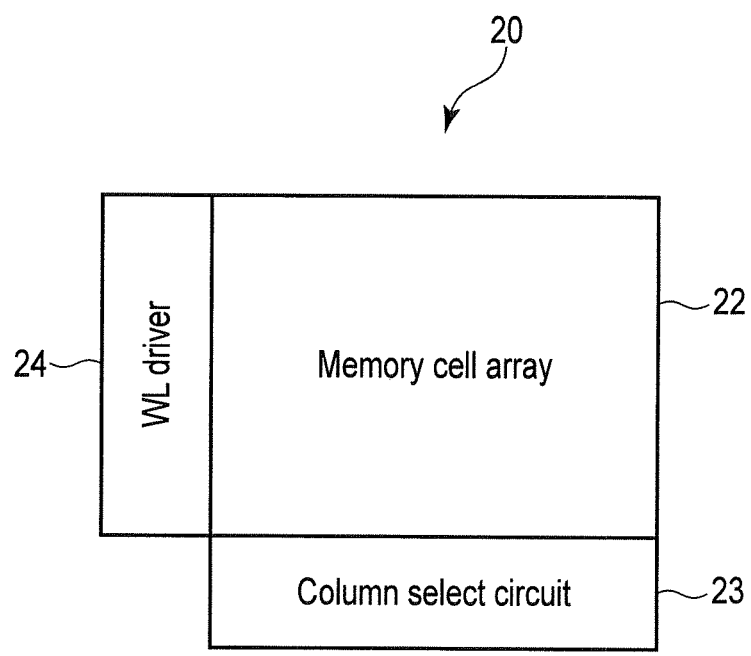
FIG. 10 is a block diagram of a memory mat.

FIG. 10 is a block diagram of a memory mat 20. Each memory mat 20 includes a memory cell array 22, a column select circuit 23, and a word line (WL) driver 24. The memory cell array 22 includes a plurality of memory cells. The column select circuit 23 selects a column of the memory cell array 22. The word line (WL) driver 24 drives one of a plurality of word lines arranged in the memory cell array 22.

FIG. 11 is a circuit diagram of a memory cell array 22. Each memory cell array 22 has a structure in which a plurality of memory cells MC are arranged in a matrix state. In the memory cell array 22, a plurality of word lines WL0 to WLm−1, a plurality of bit lines BL0 to BLn−1, and a plurality of source lines SL0 to SLn−1 are arranged. A row of the memory cell array 22 is connected to a word line WL, and a column of the memory cell array 22 is connected to a pair of a bit line BL and a source line SL.

Each memory cell MC is formed of a magneto-resistive element (MTJ (Magnetic Tunnel Junction) element) 25, and a select transistor 26. The select transistor 26 is formed of, for example, an N-channel MOSFET.

One end of the MTJ element 25 is connected to the bit line BL, and the other end is connected to a drain of the select transistor 26. A gate of the select transistor 26 is connected to the word line WL, and a source is connected to the source line SL.

A plurality of bit lines BL0 to BLn−1 are connected to a global bit line GBL via the column select circuit 23. A plurality of source lines SL0 to SLn−1 are connected to a global source line GSL via the column select circuit 23. The column select circuit 23 selects a column based on select signals LYSW0 to LYSWn−1. The global bit line GBL and the global source line GSL are connected to the sense amplifier SA.

FIG. 12 is a block diagram of a circuit portion (two memory mats and a peripheral circuit thereof) enclosed by the dashed line in FIG. 9, and the shift redundancy circuit 32.

A column select circuit 23 connected to the memory mat 20 selects a column among the 64 columns. A sense amplifier (first sense amplifier) is connected to a column select circuit 23.

A redundancy area 40 is prepared for two memory mats 20-0 to 20-1. The redundancy area 40 has the same structure as the memory cell array in the memory mat 20, and includes 64 redundancy columns. The redundancy area 40 is connected with a column select circuit 41. The column select circuit 41 selects one column among the 64 redundancy columns. A redundancy sense amplifier 42 is connected to the column select circuit 41.

A plurality of sense amplifiers 21 and the redundancy sense amplifier 42 are connected to the select circuit 30. The select circuit 30 includes a plurality of switches 30A to select even-numbered sense amplifiers, a plurality of switches 30B to select odd-numbered sense amplifiers, and a switch 30C to select the redundancy sense amplifier 42. Specifically, two adjacent sense amplifiers, one of which is even-numbered and the other of which is odd-numbered, are connected to a data line RWD via the respective switches 30A and 30B. The redundancy sense amplifier 42 is connected to the redundancy data line RRWD via the switch 30C. The switches 30A, 30B, and 30C are controlled by signals SEL_O, SEL_E, and SEL_R, respectively, transmitted from the controller 13.

The 16 data lines RWD0 to RWD15 are connected to 16 sense amplifiers 31-0 to 31-15, respectively. One redundancy data line RRWD is connected to the redundancy sense amplifier 43. The 16 sense amplifiers 31-0 to 31-15 and the redundancy sense amplifiers 43 are connected to the shift redundancy circuit 32.

In FIG. 12, the two memory mats 20-0 and 20-1 are normal areas to be replaced by the redundancy area 40. A normal replacement unit NU connected to a sense amplifier 31 is 128 columns, and a redundancy replacement unit RU connected to a redundancy sense amplifier 43 is 64 columns. Specifically, the normal replacement unit NU and the redundancy replacement unit RU are different in the number of columns. The normal replacement unit NU includes a plurality of redundancy replacement units RU (for example, two redundancy replacement units RU in the present embodiment), and a replacement operation can be performed with each redundancy replacement unit RU.

The shift redundancy circuit 32 includes switches 50-0 to 50-15, a shift control circuit 51, and failure-address memories 52-0 to 52-4.

The sense amplifiers 31-0 to 31-15 are connected to local data lines LRD0 to LRD15, respectively, and the redundancy sense amplifier 43 is connected to a local data line RD. The switch 50-0 is connected to a data line DQ0, and the local data lines LRD0 and LRD1. The switch 50-0 connects the data line DQ0 to one of the local data lines LRD0 and LRD1, based on a signal SF0 from a shift control circuit 51. The switches 50-1 to 50-14 have structures similar to the switch 50-0. The switch 50-15 is connected to a data line DQ15, and the local data lines LRD15 and RLRD. The switch 50-15 connects the data line DQ15 to one of the local data lines LRD15 and RLRD, based on a signal SF15 from the shift control circuit 51.

Figure 13:
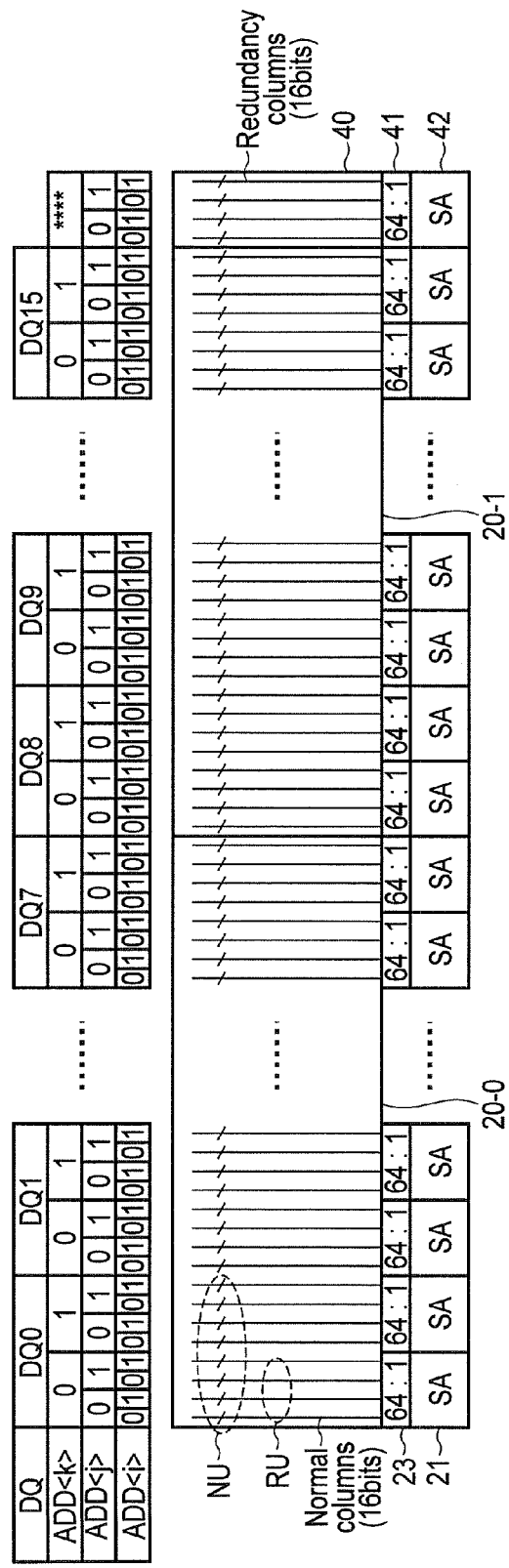
FIG. 13 is a diagram for illustrating an address used for operation of replacing a failure column.

FIG. 13 is a diagram for illustrating addresses used for an operation of replacing a failure column. A three-bit address ADD <i, j, k> is prepared as an address used for the operation of replacing a failure column. Using the address ADD <i, j, k> enables discrimination of 8 segments (1 segment is 16 columns) included in the normal replacement unit NU. In addition, in the redundancy area 40, using a two-bit address ADD <i, j> enables discrimination of four segments included in the redundancy replacement unit RU.

Figure 14:
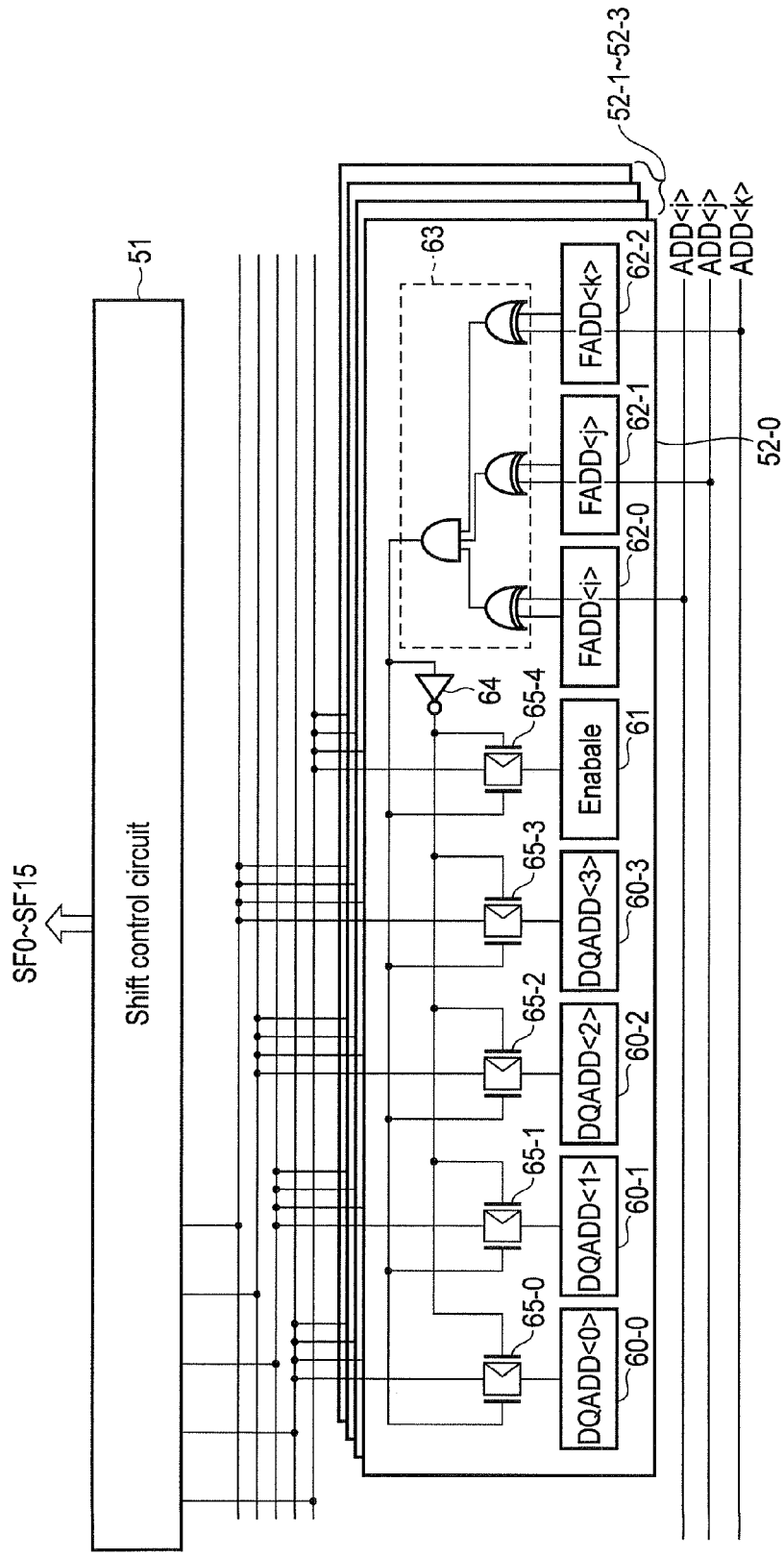
FIG. 14 is a circuit diagram of a failure-address storage module.

FIG. 14 is a circuit diagram of failure-address memories 52-0 to 52-3. The failure-address memory 52-0 includes memory elements 60-0 to 60-3, 61, 62-0 to 62-2, a comparator 63, an inverter circuit 64, and pass gates 65-0 to 65-4.

The memory elements 60-0 to 60-3 store a 4-bit failure DQ address DQADD <3:0>. The data lines DQ0 to DQ15 can be distinguished from one another, by using the 4-bit failure DQ address. The failure DQ address is information of the data line DQ corresponding to the failure column, and an address serving as a starting point of a shift operation. The memory element 61 stores enable information indicating whether the failure-address memory 52-0 stores any failure DQ address. Enable information is asserted when the failure-address memory 52-0 stores a failure DQ address.

The memory elements 62-0 to 62-2 store a failure address FADD <i, j, k>. The comparator 63 compares the address ADD <i, j, k> transmitted from the controller 13 with the failure address FADD <i, j, k>, and outputs a high-level signal when the addresses agree with each other. When the output level of the comparator 63 becomes high, the pass gates 65-0 to 65-4 are turned on, and the failure DQ address DQADD <3:0> stored in the memory elements 60-0 to 60-3 and the enable information stored in the memory element 61 are transmitted to the shift control circuit 51. The failure address memories 52-1 to 52-3 have similar structures as the failure address memory 52-0. The shift control circuit 51 generates signals SF0 to SF15 to control the switches 50-0 to 50-15, based on the outputs from the failure address memories 52-0 to 52-3.

<Operation Example of Shift Redundancy Circuit 32>

Figure 15:
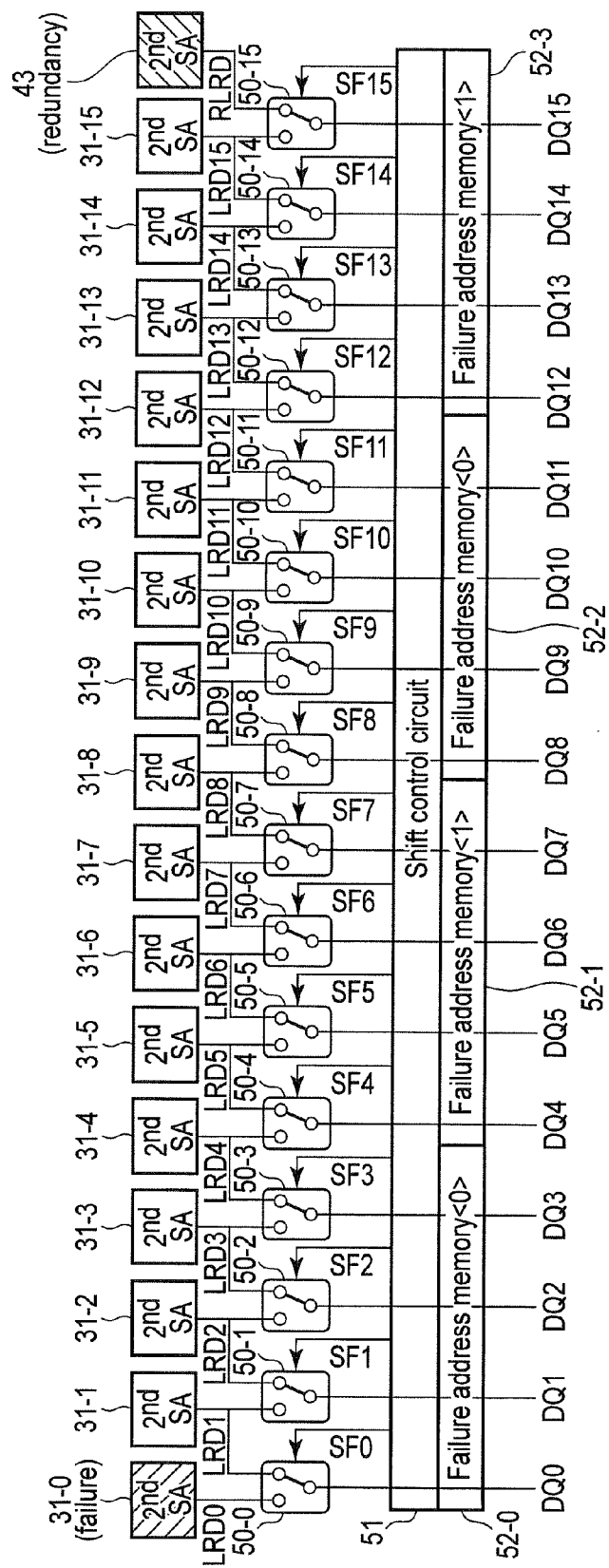
FIG. 15 is a diagram for illustrating operation of relieving a failure (1) or a failure (2) illustrated in FIG. 12.

Next, an example of operation of the shift redundancy circuit 32 will now be explained. FIG. 15 is a diagram for illustrating an operation of relieving a failure (1) or a failure (2) illustrated in FIG. 12.

When access to the failure (1) or failure (2) illustrated in FIG. 12 occurs, the shift control circuit 51 changes all the signals SF0 to SF15 to high level, based on the failure DQ address DQADD <3:0> transmitted from one of the failure-address memories 52-0 to 52-3. On receipt of the signals SF0 to SF15, the switches 50-0 to 50-15 shift the local data lines LRD to the right. Thereby, the sense amplifier 31-0 connected to the failure column is not connected to the data line DQ0. On the other hand, the redundancy sense amplifier 43 connected to the redundancy area 40 is connected to the data line DQ15. As a result, the failure column is relieved.

Figure 16:
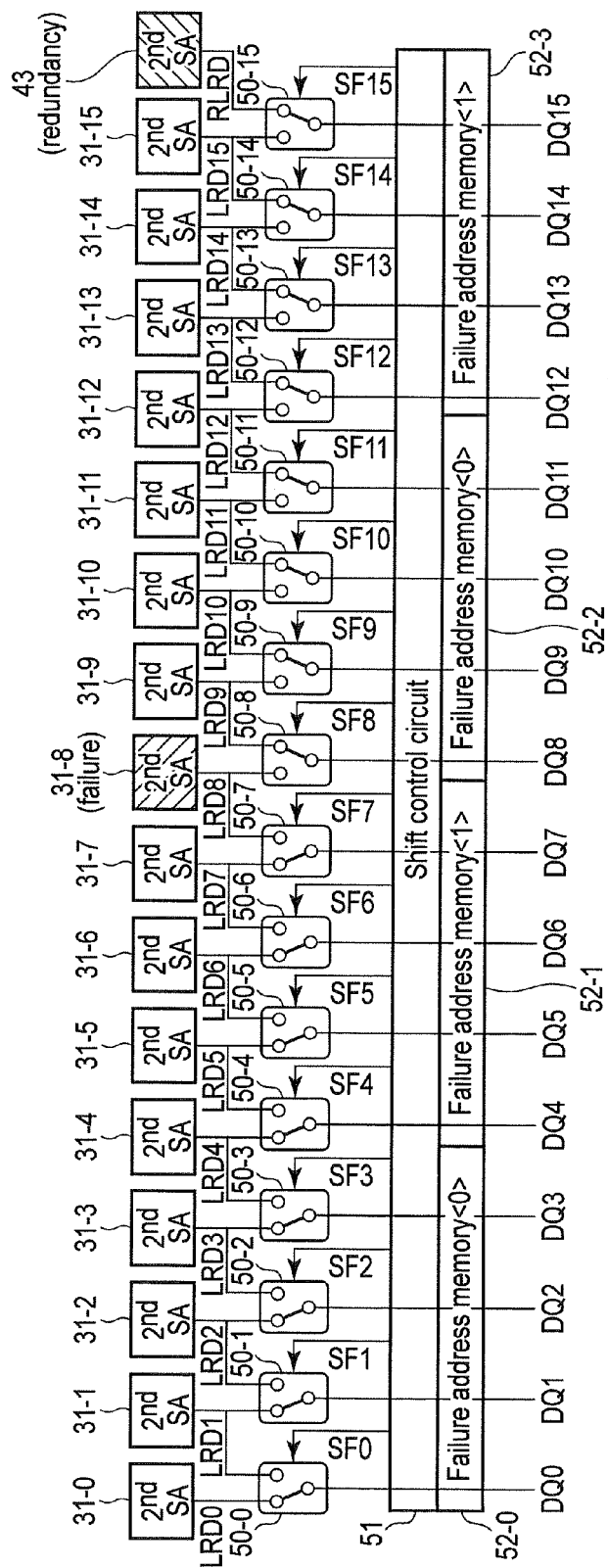
FIG. 16 is a diagram for illustrating operation of relieving a failure (3) illustrated in FIG. 12.

FIG. 16 is a diagram for illustrating an operation of relieving a failure (3) illustrated in FIG. 12. When access to the failure (3) illustrated in FIG. 12 occurs, the shift control circuit 51 changes the signals SF0 to SF7 to low level, and signals SF8 to SF15 to high level, based on the failure DQ address DQADD <3:0> transmitted from one of the failure-address memories 52-0 to 52-3. On receipt of the signals SF0 to SF7, the switches 50-0 to 50-7 do not shift the local data lines LRD, as illustrated in FIG. 16. On the other hand, on receipt of the signals SF8 to SF15, the switches 50-8 to 50-15 shift the local data lines LRD to the right, as illustrated in FIG. 16. Thereby, the sense amplifier 30-8 connected to the failure column is not connected to the data lines DQ7 or DQ8. On the other hand, the redundancy sense amplifier 43 connected to the redundancy area 40 is connected to the data line DQ15. As a result, the failure column is relieved.

<Stacked Structure of Interconnects>

Next, a stacked structure of interconnects will be explained. FIG. 17 is a cross-sectional view of a stacked structure of interconnects. The first-level interconnect layer includes a plurality of bit lines BL and a plurality of source lines SL. The second-level interconnect layer includes a plurality of global bit lines GBL and a plurality of global source lines GSL. The third-level interconnect layer includes a plurality of data line pairs RWDt, and RWDc, and shield interconnects. The interconnect width increases in the order of the first-level interconnect layer to the third-level interconnect layer. Such a stacked structure enables efficient arrangement of a plurality of types of interconnects.

<Effects>

As detailed above, according to the present embodiment, the redundancy replacement unit RU (for example, 64 columns) allocated to the redundancy sense amplifier 43 can be set smaller than the normal replacement unit NU (for example, 128 columns) allocated to a sense amplifier 31. This structure reduces the ratio of the redundancy area 40 to the normal area (two memory mats 20 in the present embodiment). For example, even when the page size is reduced and the number of columns allocated to a sense amplifier increases, the redundancy replacement operation can be performed without increasing the ratio of the redundancy area to the normal area.

In addition, the redundancy replacement unit RU is divided into, for example, four segments to be managed, using the address ADD <i, j>, and a redundancy replacement operation is performed for each segment. This structure enables an increase in the number of redundancy segments without an increase in the number of redundancy columns, and enables construction of a redundancy system with higher relief efficiency.

Further, the shift data-line replacement system is adopted as the failure relief system. The shift data-line replacement system shortens the local data lines LRD connecting the data lines DQ with the sense amplifiers 31. This structure reduces an interconnect delay of the local data lines LRD, and thus improves the operation speed.

In addition, the bank 11 is divided into four areas AR0 to AR3 arranged in a line in the column direction. This structure shortens the global bit lines GBL arranged in each area AR, and thus reduces the resistance and the capacity of the global bit lines GBL. This structure reduces the read current, and further improves the operation speed.

The above embodiment may also be applied to a data-line replacement system, in which a failure data line is replaced with a redundancy data line.

Although an MRAM using a magneto-resistive device is explained as an example of the semiconductor memory device in the above embodiment, the semiconductor memory device is not limited to such. The embodiment is applicable to various types of semiconductor memory devices, including volatile memories and nonvolatile memories. The embodiment is also applicable to a resistance-change type memory, such as an ReRAM (Resistive Random Access Memory) and a PCRAM (Phase-Change Random Access Memory).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a bank including a normal area including normal columns, and a redundancy area including redundancy columns and to be replaced with a failure column of the normal area;
   sense amplifiers connected to the normal area; and
   a redundancy sense amplifier connected to the redundancy area,
   wherein a normal replacement unit is formed of normal columns allocated to each of the sense amplifiers,
   a redundancy replacement unit is formed of redundancy columns allocated to the redundancy sense amplifier, and
   the redundancy replacement unit is smaller than the normal replacement unit.

2. The device of claim 1, further comprising a select circuit configured to select one of groups included in the normal area,
   wherein the normal area includes memory units, each of which has a size equal to the redundancy replacement unit, and
   each of the groups includes part of the memory units.

3. The device of claim 2, wherein
   the groups includes a first group and a second group,
   the first group includes even-numbered memory units among the memory units, and
   the second group includes odd-numbered memory units among the memory units.

4. The device of claim 1, further comprising:
   first data lines provided for the respective sense amplifiers; and
   a shift circuit configured to control connection of the sense amplifiers and the redundancy sense amplifier to the first data lines,
   wherein the shift circuit shifts data lines arranged on a side of a data line, which serves as a starting point and to which data of the failure column is to be transmitted, one by one, and connects one of the first data lines to the redundancy sense amplifier.

5. The device of claim 4, wherein
   the shift circuit includes switches switching connection of the sense amplifiers and the redundancy sense amplifier to the first data lines, and
   each of the switches connects one of adjacent sense amplifiers to the data line.

6. The device of claim 5, wherein the shift circuit includes:
   a memory element storing a failure address;
   a comparator comparing an address to be accessed with the failure address; and
   a control circuit configured to control the switches based on an output of the comparator.

7. The device of claim 4, wherein
   the normal replacement unit is divided into segments, and
   the shift circuit performs a replacement operation for each of the segments.

8. The device of claim 1, wherein the bank is formed of an MRAM.

9. A semiconductor memory device comprising:
   a bank including memory areas arranged in a column direction, each of the memory area including a normal area including normal columns, and a redundancy area including redundancy columns and to be replaced with a failure column of the normal area;
   sense amplifiers connected to the normal area; and
   a redundancy sense amplifier connected to the redundancy area,
   wherein a normal replacement unit is formed of normal columns allocated to each of the sense amplifiers,
   a redundancy replacement unit is formed of redundancy columns allocated to the redundancy sense amplifier, and
   the redundancy replacement unit is smaller than the normal replacement unit.

10. The device of claim 9, further comprising a select circuit configured to select one of groups included in the normal area, wherein the normal area includes memory units, each of which has a size equal to the redundancy replacement unit, and
each of the groups includes part of the memory units.

11. The device of claim 10, wherein
the groups include a first group and a second group,
the first group includes even-numbered memory units among the memory units, and
the second group includes odd-numbered memory units among the memory units.

12. The device of claim 9, further comprising:
first data lines provided for the respective sense amplifiers; and
a shift circuit configured to control connection of the sense amplifiers and the redundancy sense amplifier to the first data lines,
wherein the shift circuit shifts data lines arranged on a side of a data line, which serves as a starting point and to which data of the failure column is to be transmitted, one by one, and connects one of the first data lines to the redundancy sense amplifier.

13. The device of claim 12, wherein
the shift circuit includes switches switching connection of the sense amplifiers and the redundancy sense amplifier to the first data lines, and
each of the switches connects one of adjacent sense amplifiers to the data line.

14. The device of claim 13, wherein the shift circuit includes:
a memory element storing a failure address;
a comparator comparing an address to be accessed with the failure address; and
a control circuit configured to control the switches based on an output of the comparator.

15. The device of claim 12, wherein
the normal replacement unit is divided into segments, and
the shift circuit performs a replacement operation for each of the segments.

16. The device of claim 9, wherein the bank is formed of an MRAM.

* * * * *